(12) United States Patent
Iadanza et al.

(10) Patent No.: US 7,089,512 B2
(45) Date of Patent: Aug. 8, 2006

(54) METHOD FOR OPTIMAL USE OF DIRECT FIT AND INTERPOLATED MODELS IN SCHEMATIC CUSTOM DESIGN OF ELECTRICAL CIRCUITS

(75) Inventors: Joseph A. Iadanza, Hinesburg, VT (US); Raminderpal Singh, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 10/708,608

(22) Filed: Mar. 15, 2004

(65) Prior Publication Data
US 2005/0204318 A1    Sep. 15, 2005

(51) Int. Cl.
*G06F 17/50* (2006.01)
(52) U.S. Cl. .................. 716/4; 716/1; 716/2; 716/5
(58) Field of Classification Search .................. 716/4, 716/5, 2, 1; 703/14; 702/27
See application file for complete search history.

(56) References Cited

U.S. PATENT DOCUMENTS 6,212,490 B1 * 4/2001 Li et al. ..................... 703/14
6,345,235 B1 * 2/2002 Edgecombe et al. ......... 702/27
2004/0044510 A1 * 3/2004 Zolotov et al. .............. 703/14
2004/0181761 A1 * 9/2004 Kidera ......................... 716/2

* cited by examiner

*Primary Examiner*—Sun James Lin
(74) *Attorney, Agent, or Firm*—Gibb I.P. Law Firm, LLC; Richard A. Henkler, Esq.

(57) ABSTRACT

A method of analyzing and designing circuits comprising creating a set of interpolated models for transistor devices; creating a set of characterized (direct fit) models for the transistor devices; analyzing the transistor devices within a netlist for matches in the set of characterized models; and providing a choice of using the matched characterized models or one of the interpolated models in designing the circuits. The method further comprises schematically simulating a custom circuit; back annotating to a schematic circuit which of the transistors use direct-fit models and which of the transistor devices are interpolated; determining whether the transistor devices are in any of cutoff, saturation, static linear, and dynamic linear mode during simulation of the custom circuit; removing the saturation and dynamic linear mode transistor devices; back annotating the netlist to a schematic with a predetermined device state; and performing sensitivity analysis on saturation and dynamic linear mode transistor devices.

22 Claims, 3 Drawing Sheets

METHOD FOR OPTIMAL USE OF DIRECT FIT AND INTERPOLATED MODELS IN SCHEMATIC CUSTOM DESIGN OF ELECTRICAL CIRCUITS

BACKGROUND OF INVENTION

1. Field of the Invention

The invention generally relates to electrical circuit design, and more particularly to a system and method for using direct fit and interpolated models in analyzing and designing electrical circuits.

2. Description of the Related Art

In order to create better circuits, circuit designers must depend on improved transistor models. However, circuit designers are seldom privy to information on how the models were generated such as device sizes that were characterized and their bias conditions. Seldom does the circuit designer have information about how the model was constructed, which device sizes (length, width, finger length) were directly characterized, and which device sizes are interpolated from characterized data. In addition, conventional device models typically employed in simulation are constructed to interpolate device performance parameters over a large number of physical, electrical, and environmental variables such that all devices in the netlist use the same generalized model. While this conventional approach eases simulation problems it does not provide optimal accuracy for device sizes which are actually characterized or provide the design information on what device topologies contributed to the model, which all lead to inaccuracy in simulation.

Therefore, due to the drawbacks and limitations of the conventional systems and methods there remains a need for a novel system and method for transistor level simulation to aid electrical circuit engineers in the design and analysis of circuits.

SUMMARY OF INVENTION

In view of the foregoing, an embodiment of the invention provides a method of analyzing and designing circuits comprising creating a set of interpolated models for transistor devices; creating a set of characterized (direct fit) models for the transistor devices; analyzing the transistor devices within a netlist for matches in the set of characterized (direct fit) models; and providing a choice of using the matched characterized (direct fit) models or one of the interpolated models in designing the circuits. The method further comprises schematically simulating a custom circuit; back annotating to a schematic circuit which of the transistors use direct-fit models and which of the transistor devices are interpolated; determining whether the transistor devices are in any of cutoff, saturation, static linear, and dynamic linear mode during simulation of the custom circuit; extracting the saturation and dynamic linear mode transistor devices; back annotating the netlist to a schematic with a predetermined device state; and performing sensitivity analysis on saturation and dynamic linear mode transistor devices.

According to the method the sensitivity analysis determines which transistor devices most affect design criteria, wherein once the transistor devices most affecting design criteria are identified, the transistor devices are specified with a closest characterized (direct fit) model in a most to least critical order to fit most of the design criteria into a direct fit simulation, and wherein the interpolated models and the characterized (direct fit) models comprise parallel sets of models to characterize transistor device sizes and parameters including electrical and environmental conditions.

The method further comprises recognizing transistor devices in the netlist which may be simulated with the characterized (direct fit) models; providing feedback information relating to which transistor devices use the characterized (direct fit) models; analyzing the netlist to determine which transistor devices using interpolated models would benefit from using the characterized (direct fit) models; simulating changes to the netlist to facilitate switching to characterized (direct fit) models; and back annotating a series of scenarios to a circuit design layout framework for designer selection.

The method further comprises using direct fit (information) tags for propagation to the circuit design layout for each transistor device; selecting the propagated information tags in netlist parasitic extraction; and simulating the parasitic netlist to ensure post-layout integrity.

These, and other aspects and advantages of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
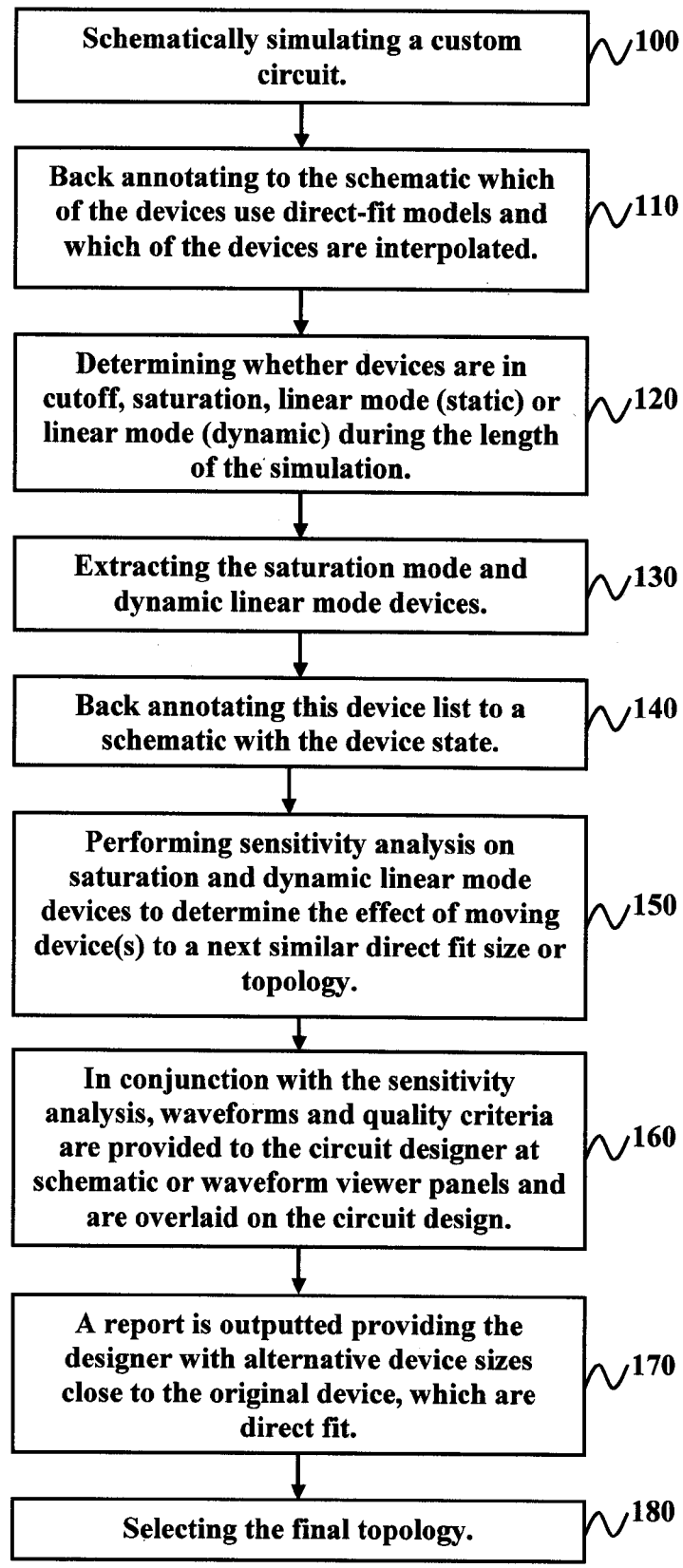
FIG. 1 is a flow diagram illustrating an embodiment of the invention.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

Figure 2:
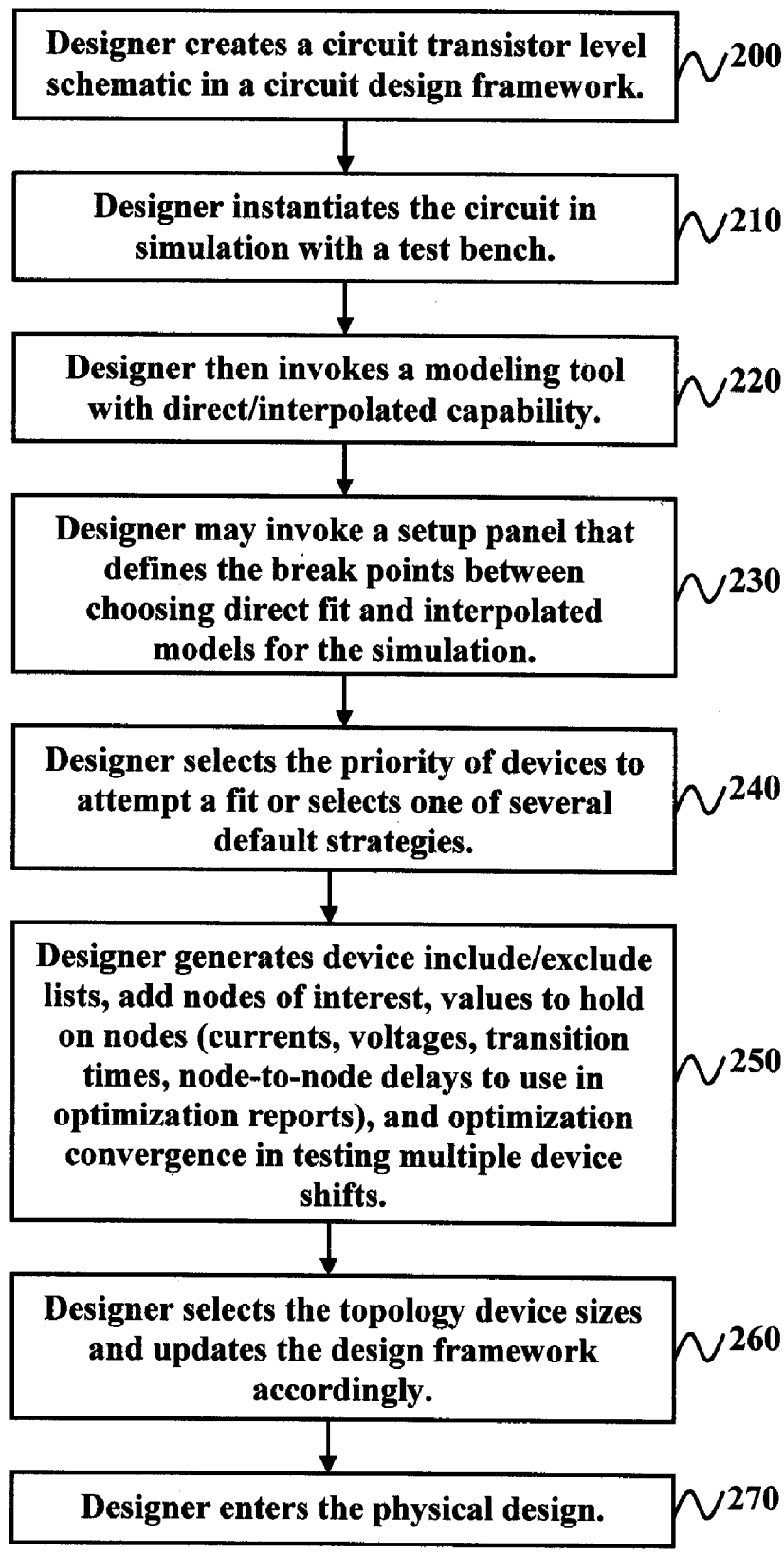
FIG. 2 is a flow diagram illustrating an alternate embodiment of the invention.
Figure 3:
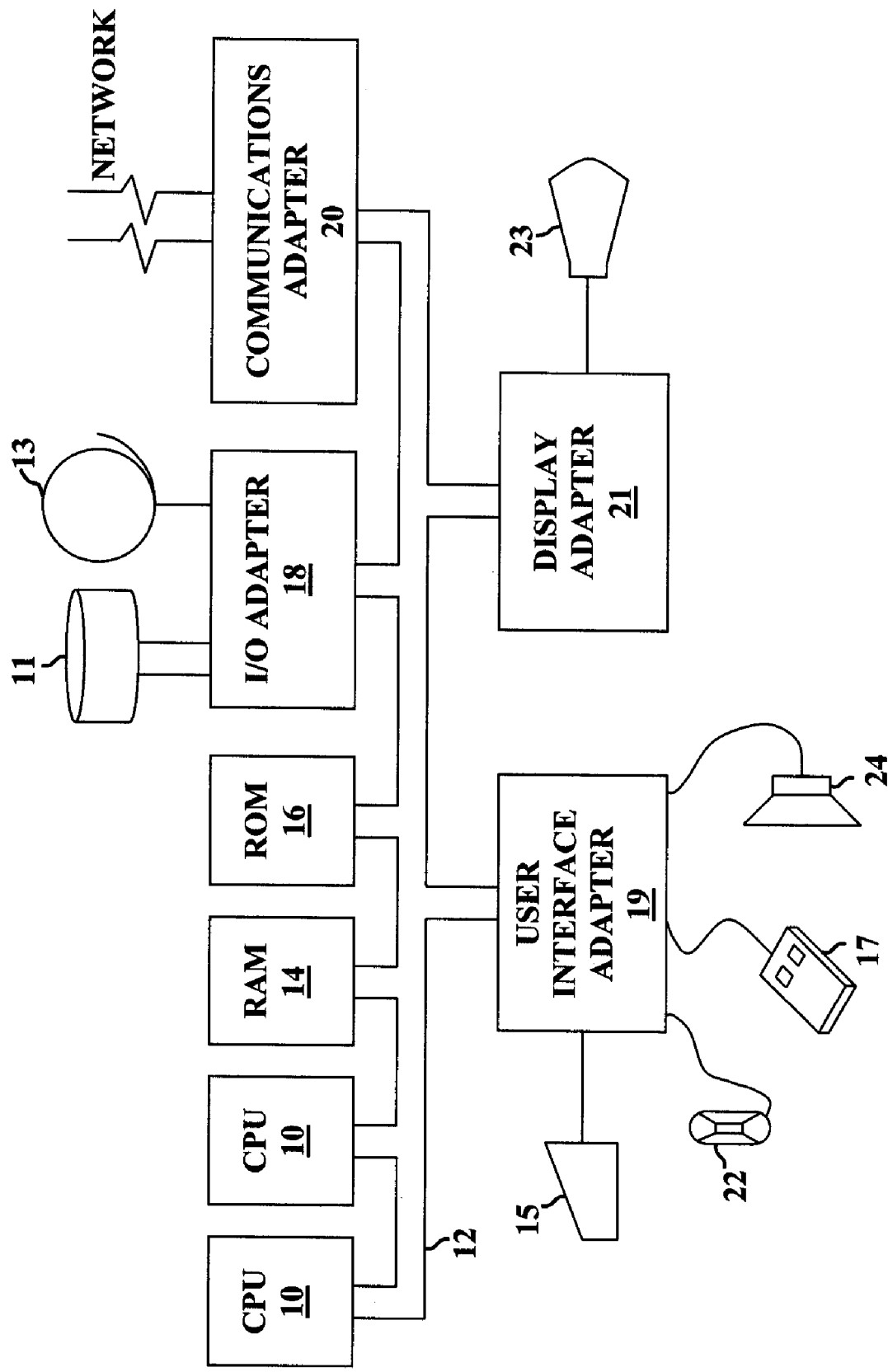
FIG. 3 is a computer system diagram according to an embodiment of the invention.

As mentioned, there is a need for a system and method for transistor level simulation to aid electrical circuit engineers in the design and analysis of circuits. Referring now to the drawings and more particularly to FIGS. 1 through 3, there are shown preferred embodiments of the invention. The invention operates in the following manner. A circuit designer submits a netlist for transistor level simulation. The netlist can be derived from the design schematic or with parasitic extraction, which keeps device parameters of transistor length (L), transistor total width (W), and the number of sections (fingers) (F), each of equal finger width, W per finger, which the transistor's W is divided into in the design (i.e.; it doesn't break up W by more than the number of fingers in the transistor per finger to add gate resistance such that the true topology is retained).

Entering into simulation, model usage is assigned by the simulation tool. Devices with Ls and Ws that directly match those on which the model is constructed use fit data for that device. Devices that do not directly match use an interpolated model set. As used herein, an interpolated model set is a set of data points derived between points in a known data set, and more particularly, is an unknown model set derived from selected data points between known data points in a known data set. As illustrated in the flowchart of FIG. 1 depicting an embodiment of the invention, the method of analyzing and designing circuits comprises, first, schematically simulating 100 a custom circuit. Second, the invention back annotates 110 to the schematic which of the devices use direct-fit models and which of the devices are interpolated. Next, the invention determines 120 whether devices are in cutoff, saturation, linear mode (static) or linear mode (dynamic) during the length of the simulation. The next steps of the invention involve extracting 130 the saturation mode and dynamic linear mode devices, and back annotating 140 this device list to a schematic with the device state. Thereafter, sensitivity analysis is performed 150 on saturation and dynamic linear mode devices to determine the effect of moving device(s) to a next similar direct fit size or topology. The sensitivity analysis is conducted on both single device and multiple device combinations. In conjunction with the sensitivity analysis, waveforms and quality criteria are provided 160 to the circuit designer at schematic or waveform viewer panels and are overlaid on the circuit design. Then, a report is output 170, providing the designer with alternative device sizes close to the original device, which are direct fit. The designer selects 180 the final topology.

A schematic (either stick or extracted) simulation recognizes devices in a circuit design, which have direct fit to devices characterized in model generation (L and W per finger). For recognized devices, a model based on only this device size is used. For unrecognized devices, an interpolated model is used. The simulation is run, and information is back annotated to the schematic on which type of model was discovered.

During initial simulation, devices are characterized as switching, static, cutoff linear, saturated. Devices using interpolated models and which are not in static, cutoff, or static linear states are placed into a set of transistors for which optimization to direct fit models is to be attempted.

The set is used to do sensitivity analysis using user-defined criteria, varying set devices' L, W, and F to determine which devices most affect performance criteria such as circuit delay, output transition times, node voltages or currents, frequencies or stability of the function over changes in electrical or environmental stimulus. Devices in the set may be marked by the designer for their order of importance in conversion to direct fit models or alternatively, sensitivity analysis may be performed, varying the L, W and F of each device to determine order-of-importance as a function of simulated sensitivity. Once identified, devices are re-specified with the closest direct fit device models in the most to least critical order to fit most of the design into the direct fit simulation. This gives the highest confidence in modeling accuracy without the designer having to understand the device points on which the model was generated. As mentioned, the critical order is determined by the result of sensitivity analysis and/or by designer choice The invention provides parallel sets of models, one interpolated and one a series of direct fit models to characterized device sizes, and/or other parameters such as electrical or environmental conditions. Moreover, the invention provides a methodology of recognizing devices in a netlist, which may be simulated with direct fit models, and then providing feedback information to a circuit designer on which devices have used direct fit models. In addition, the methodology provided by the invention analyzes the netlist to determine which devices using interpolated models would most benefit from the use of direct fit models, and suggests and simulates changes to the netlist to facilitate switching to direct fit models, and back annotates a series of scenarios to the design framework for designer selection. Also, the invention provides a tool which uses directly characterized models where possible, and suggests and tests alternatives to interpolated models where a directly characterized, or set of directly characterized devices of similar size can be substituted, and displays to the designer model origin in simulation.

The invention provides a standard device model and a set of device models each with a specific topology that is directly characterized. Devices are characterized electrically. Known voltage or current biases are placed on nodes of the device (for instance, gate, drain, source and substrate of a FET) and the current generated between nodes is measured. Currents measured under ranges of bias conditions are fit to a model equation. The invention guides designers to the use of this second set of models where possible by analysis of schematics in simulation, sensitivity analysis to determine critical devices, automatic alternative simulation, and feedback to the designer.

From the perspective of the designer, FIG. 2 illustrates the methodology practiced by the designer with respect to the invention. First, the designer creates 200 a circuit transistor level schematic in a circuit design framework (for example Cadence®, available from Cadence Design Systems, Inc., California, USA. Generally, Cadence® is a suite of design automation/assistance software. Cadence® enables assembly of a circuit from components such as transistors, resistors, capacitors, etc. defined in a "design library", simulation of the assembled circuit using simulators such as HSPICE® (available from Synopsys, Inc., California, USA) or SPECTRE® (available from Cadence Design Systems, Inc., California, USA), as well as physical layout and verification of the circuit.)

Then, the designer instantiates 210 the circuit in simulation with a test bench. The designer then invokes 220 a modeling tool with direct/interpolated capability. The modeling tool (circuit simulator) simulates the behavior of the circuit under electrical stimulation (i.e. what happens to the circuit outputs under certain constant and varying circuit inputs. The benefit of the new modeling tool is recognition of device sizes for which a more accurate electrical model is available. Next, the designer may invoke 230 a setup panel that defines the break points between choosing direct fit and interpolated models for the simulation. The default is that Ls and Ws for each finger of the schematized device must match for the direct fit model to be used. This is the default mode, not an all-simulation requirement. As a default, it ensures that the DF model is only used where most appropriate. It also simplifies the DF model as it would not have to interpolate locally.

However, the designer may alter the default to use the model within the specified absolute or percentage tolerance of the model fit point. Other pre-set possibilities for variance may be provided within this panel. For example, these may include selecting DF (direct fit) vs. IF (interpolated fit) only on direct match of Device L, Device W or some recommended percent or an absolute value of range of any/all parameters in an assignment function such as W, L and device fingers. The capability in this panel implies that the models may accept L and W as a variable, even though they are optimized around the direct fit point. The direct fit point is the device parameters (L, W, device fingers) that were electrically characterized to generate the DF model for a device. There would be a direct fit point for each of many DF models for a given technology. This could be implemented as a third model set (direct fit, locally interpolated, fully interpolated). Once the designer has specified their model selection sensitivity, the settings are saved and the designer proceeds to simulation.

The tool that performs initial simulation (HSPICE®, SPECTRE®, HSIM®, or similar tool), returns with an initial simulation/model selection/device state in back annotation and the optimization setup window pops-up. Next, the designer selects 240 the priority of devices to attempt a fit or selects one of several default strategies. The designer also has the ability to generate 250 device include/exclude lists, add nodes of interest, values to hold on nodes (currents, voltages, transition times, node-to-node delays to use in optimization reports), and optimization convergence in testing multiple device shifts. If timings or voltage values go undefined here, the designer could then select the default where, on chosen nodes, optional runs are used to attempt to meet base run timings/voltages/currents.

The optimization pass submitted by the designer returns with overlays of node values for multiple tries/plots, statistics for each run on proximity to ideal, etc, and allows the designer to select the topology for the final circuit schematic. The designer selects 260 the topology device sizes and updates the design framework accordingly.

Thereafter, the designer enters 270 the physical design. Here, devices marked direct fit in the schematic are propagated to layout as PCELLs with a marker layer ("DF" for example) over the device (the PCELL is used as an example as it helps in passing the DF attribute to layout (other means may be employed) and imposes some uniformity on the layout that betters model-to-hardware correlation. A PCELL is a "parameterized cell". It is essentially a predefined physical layout for a device such as a resistor, transistor, etc where the key parameters (such as L, W and number of fingers) are variables. As the designer changes any of these key parameters, the cell stretches, expands, etc. To meet the device specification while maintaining a consistent layout (contact periodicity, dimensions of contact regions, etc). If during the layout the designer needs minor modification, the PCELL may be flattened or the layout (non-PCELL) may be modified. PCELLs are copied to a safe layer for checking in extraction. The DF layer may be deleted if the designer recognizes that the physical design does not adhere to typical layout standards after modification (use interpolated model because of modifications), but not modified or added.

In extraction, devices with DF are processed separately. DFs get processed directly and are handled to maintain recognition in simulation. DFs with back-levels (PCELL or non-PCELL origin) are first compared to their original layouts, to ensure that gate size/topology and contact (i.e., the connection from a metal level to a polysilicon or diffusion node of the device) spacing haven't changed, and if true, DF is processed as if it were a PCELL with a warning generated in the extraction that the non-PCELL DF was passed. If not true, then the DF is ignored, and the netlist converts the DF to an interpolated layout.

To further describe the invention, an example is provided. A schematic for a simple CMOS inverting buffer (IB) is entered into the design framework. This inverter device sizes are initially specified to balance the rising and falling delays through the circuit. Accordingly, the device aspect ratio for the NFET is set at W/Lmin and the device aspect ratio for the PFET is set at (W*2.5)/Lmin. The IB is instantiated into a testbench within the framework which provides an input stimulus, supply voltage stimulus and output load. When the simulation tool is brought up, the default for the DF device recognition is accepted such that only devices, which match those with which the model was generated, are recognized as DF.

Next, the simulation is invoked. The front end of the simulator recognizes the NFET (W/Lmin) as a DF topology and assigns simulation of the NFET to a DF model. A DF model for the PFET with W*2.5 does not exist so it is simulated with an interpolated model. Initial simulation produces input and output waveforms, path delays and output transition times and a ratio of rise delay/fall delay as a function of (input waveform, supply voltage, output load) combinations simulated. It also back annotates to the design framework such that both FETs are linear-mode switching devices, wherein the PFET is simulated using interpolated models, and the NFET is simulated with a direct fit model.

The PFET is identified as the only interpolated model device in this schematic. The designer picks a default strategy for optimization (only the PFET is to be optimized). Optionally, the ratio of Rdly/Fdly (rising delay of the circuit/falling delay of the circuit) is assigned as an indicator of the circuit performance to be monitored in optimization with a target value of 1.

Next, the optimization is submitted. The NFET remains fixed in value. Available DF models for the PFET include W/Lmin, W*2/Lmin, W*3/Lmin, W*10/Lmin as well as various values of W for higher L values. Since the L of the PFET matches a DF model, only W will be varied. The optimization is set to run with PFET Ws within 50% of the original W, or to the nearest available DFs if outside 50%. In this case, runs at 2W and 3W are performed. Essentially, this is step 150 in FIG. 1. Sensitivity analysis is performed with the PFET at 2W/Lmin and 3W/Lmin to simulate the effect of moving the PFET to a DF model. Data including waveforms, delays, transition times and ratios are reported for each run. The ratio of Rdly/Fdly assigned as the performance monitor is shown for each run. The designer reviews the ratio for each optimization run and the original run and decides that 3W provides an acceptable ratio and has the additional advantage of being simulated with all DF models. With the 3W case selected, a PFET width of 3W is automatically updated to the design framework.

With the schematic design complete, the inverter physical design is finished. DF tags are propagated to the layout for each device and are selected in netlist parasitic extraction. The parasitic netlist is re-simulated to ensure post-layout integrity (again monitoring Rdly/Fdly). DF tags are passed into the extracted netlist to ensure that DF models will be used in the simulation, which allows for any capabilities in the extractor to break up device widths into smaller sections to add gate resistance while maintaining the ability to recognize DF devices.

A representative hardware environment for practicing the present invention is depicted in FIG. 3, which illustrates a typical hardware configuration of an information handling/computer system in accordance with the invention, having at least one processor or central processing unit (CPU) 10. The CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 24, microphone 22, and/or other user interface devices such as a touch screen device (not shown) to bus 12, communication adapter 20 for connecting the information handling system to a data processing network, and display adapter 21 for connecting bus 12 to display device 23. A program storage device readable by the disk or tape units is used to load the instructions, which operate the invention, which is loaded onto the computer system.

The invention provides a novel approach to analyzing and designing electrical circuits by providing a standard device model and a set of device models each with a specific topology that is directly characterized, and then guiding designers on how to use this set of device models where possible by analyzing schematics in simulation, using sensitivity analysis to determine critical devices, using an automatic alternative simulation, and providing feedback to the designer of alternative device sizes and the simulated results. There are several advantages that the invention achieves. For example, circuits can be designed which more closely match their simulations when manufactured, and the enabling of more precise circuit design without foreknowledge of the simulation (electrical) model construction and content. Additionally, the invention allows for automatic sensitivity analysis of circuits (time savings). Other applications and/or environments that could benefit from the invention are any design activity which progresses using simulation tools derived from specific characterization results to predict more generalized behavior. This could be the mechanical (dynamic) simulation of machines or other types of simulation such as fluids, pneumatics, etc.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

The invention claimed is:

1. A method of analyzing a custom circuit, said method comprising:
    creating a set of interpolated models for transistors;
    creating a set of characterized models for said transistors;
    schematically simulating said custom circuit;
    back annotating to a schematic circuit which of said transistors use direct-fit models and which of said transistors are interpolated;
    analyzing said transistors within a netlist for matches in said set of characterized models; and
    providing a choice of using the matched set of characterized models or one of said set of interpolated models in designing said custom circuit.

2. The method of claim 1, further comprising:
    determining whether said transistors are in any of cutoff, saturation, static linear, and dynamic linear mode during simulation of said custom circuit;
    extracting the saturation and dynamic linear mode transistors;
    back annotating said netlist to a schematic with a predetermined device state; and performing sensitivity analysis on said saturation and dynamic linear mode transistors.

3. The method of claim 2, wherein said sensitivity analysis determines which transistors most affect design criteria.

4. The method of claim 3, wherein once said transistors most affecting design criteria are identified, said transistors are specified with a closest characterized model in a most to least critical order to fit most of said design criteria into a direct fit simulation.

5. The method of claim 1, wherein said set of interpolated models and said set of characterized models comprise parallel sets of models to characterize transistor sizes and parameters including electrical and environmental conditions.

6. The method of claim 1, further comprising:
    recognizing transistors in said netlist which may be simulated with said set of characterized models;
    providing feedback information relating to which transistors use said set of characterized models;
    analyzing said netlist to determine which transistors using said set of interpolated models would benefit from using said set of characterized models;
    simulating changes to said netlist to facilitate switching to said set of characterized models; and
    back annotating a series of scenarios to a circuit design layout framework for designer selection.

7. The method of claim 6, further comprising:
    using information tags for propagation to said circuit design layout framework for each transistor;
    selecting the propagated information tags in netlist parasitic extraction; and
    simulating the netlist parasitic extraction to ensure post-layout integrity.

8. A method of designing a custom circuit, said method comprising:
    creating interpolated models for devices;
    creating direct fit models for said devices;
    schematically simulating said custom circuit;
    back annotating to a schematic circuit which of said devices use said direct-fit models and which of said devices are interpolated;
    analyzing said devices within a netlist for matches in said direct fit models; and
    providing a choice of using the matched direct fit models or one of said interpolated models in designing said custom circuit.

9. The method of claim 8, further comprising:
    determining whether said devices arc in any of cutoff, saturation, static linear, and dynamic linear mode during simulation of said custom circuit;
    extracting the saturation and dynamic linear mode devices;
    back annotating said netlist to a schematic with a predetermined device state; and performing sensitivity analysis on said saturation and dynamic linear mode devices.

10. The method of claim 9, wherein said sensitivity analysis determines which devices most affect design criteria.

11. The method of claim 10, wherein once said devices most affecting design criteria are identified, said devices are specified with a closest direct fit model in a most to least critical order to fit most of said design criteria into a direct fit simulation.

12. The method of claim 8, wherein said interpolated models and said direct fit models comprise parallel sets of models to characterize transistor sizes and parameters including electrical and environmental conditions.

13. The method of claim 8, further comprising:
recognizing devices in said netlist which may be simulated with said direct fit models;
providing feedback information relating to which devices use said direct fit models;
analyzing said netlist to determine which devices using said interpolated models would benefit from using said direct fit models;
simulating changes to said netlist to facilitate switching to direct fit models; and
back annotating a series of scenarios to a circuit design layout framework for designer selection.

14. The method of claim 13, further comprising:
using information tags for propagation to said circuit design layout framework for each device;
selecting the propagated information tags in netlist parasitic extraction; and
simulating the netlist parasitic extraction to ensure post-layout integrity.

15. A program storage device readable by a computer, tangibly embodying a program of instructions executable by said computer to perform a method of analyzing and designing a custom circuit, said method comprising:
creating interpolated models for transistor devices;
creating characterized models for said transistor devices;
schematically simulating said custom circuit;
back annotating to a schematic circuit which of said transistor devices use direct-fit models and which of said transistor devices are interpolated;
analyzing said transistor devices within a netlist for matches in said characterized models; and
providing a choice of using the matched characterized models or one of said interpolated models in designing said custom circuits.

16. The program storage device of claim 15, wherein said method further comprises:
determining whether said transistor devices are in any of cutoff, saturation, static linear, and dynamic linear mode during simulation of said custom circuit;
extracting the saturation and dynamic linear mode transistor devices;
back annotating said netlist to a schematic with a predetermined device state; and
performing sensitivity analysis on said saturation and dynamic linear mode transistor devices.

17. The program storage device of claim 16, wherein said sensitivity analysis determines which transistor devices most affect design criteria.

18. The program storage device of claim 17, wherein once said transistor devices most affecting design criteria are identified, said transistor devices are specified with a closest characterized model in a most to least critical order to fit most of said design criteria into a direct fit simulation.

19. The program storage device of claim 15, wherein said interpolated models and said characterized models comprise parallel sets of models to characterize transistor device sizes and parameters including electrical and environmental conditions.

20. The program storage device of claim 15, wherein said method further comprises:
recognizing transistor devices in said netlist which may be simulated with said characterized models;
providing feedback information relating to which transistor devices use said characterized models;
analyzing said netlist to determine which transistor devices using said interpolated models would benefit from using said characterized models;
simulating changes to said netlist to facilitate switching to said characterized models; and
back annotating a series of scenarios to a circuit design layout framework for designer selection.

21. The program storage device of claim 20, wherein said method further comprises:
using information tags for propagation to said circuit design layout framework for each transistor device;
selecting the propagated information tags in netlist parasitic extraction; and
simulating the netlist parasitic extraction to ensure post-layout integrity.

22. A method off analyzing a custom circuit, said method comprising:
creating interpolated models for transistors;
creating characterized models for said transistors;
schematically simulating said custom circuit;
determining whether said transistors are in any of cutoff, saturation, static linear, and dynamic linear mode during simulation of said custom circuit;
extracting the saturation and dynamic linear mode transistors;
analyzing said transistors within a netlist for matches in said characterized models;
providing a choice of using the matched characterized models or one of said interpolated models in designing said custom circuit; and
performing sensitivity analysis on said saturation and dynamic linear mode, transistors.

* * * * *